United States Patent
Van Der Sluis et al.

(10) Patent No.: US 9,219,213 B2
(45) Date of Patent: Dec. 22, 2015

(54) COOKING STOVES

(75) Inventors: Paul Van Der Sluis, Eindhoven (NL);
Sudhakaran Subramanian, Coimbatore (IN)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 2450 days.

(21) Appl. No.: 11/909,823

(22) PCT Filed: Mar. 27, 2006

(86) PCT No.: PCT/IB2006/050920
§ 371 (c)(1),
(2), (4) Date: Jul. 9, 2008

(87) PCT Pub. No.: WO2006/103613
PCT Pub. Date: Oct. 5, 2006

(65) Prior Publication Data
US 2009/0025703 A1    Jan. 29, 2009

(30) Foreign Application Priority Data

Mar. 29, 2005 (EP) .................................. 05102466
Nov. 8, 2005 (EP) .................................. 05110490

(51) Int. Cl.
*H01L 35/00* (2006.01)
*F24B 1/20* (2006.01)
*F24B 5/02* (2006.01)

(52) U.S. Cl.
CPC ............... *H01L 35/00* (2013.01); *F24B 1/202* (2013.01); *F24B 5/021* (2013.01)

(58) Field of Classification Search
USPC ............... 126/25 R, 9 R, 38, 15 A; 136/218; 416/241 R
See application file for complete search history.

(56) References Cited

U.S. PATENT DOCUMENTS

| | | | |
|---|---|---|---|
| 2,501,627 A | | 3/1950 | Findley |
| 2,519,241 A | * | 8/1950 | Findley .................... 126/116 A |
| 3,279,452 A | * | 10/1966 | Hottenroth et al. ......... 126/25 R |
| 3,868,943 A | | 3/1975 | Hottenroth et al. |
| 4,341,988 A | * | 7/1982 | Small ............................ 320/158 |
| 4,616,627 A | * | 10/1986 | Haygood ........................ 126/77 |
| 4,773,847 A | * | 9/1988 | Shukla et al. ................... 431/46 |
| 5,024,208 A | * | 6/1991 | Hottenroth et al. ......... 126/25 R |
| 5,168,860 A | * | 12/1992 | Kibourian ................... 126/25 R |

(Continued)

FOREIGN PATENT DOCUMENTS

| | | |
|---|---|---|
| GB | 1226301 | 3/1971 |
| GB | 2081888 A | 2/1982 |

(Continued)

*Primary Examiner* — Gregory Huson
*Assistant Examiner* — Daniel E Namay

(57) ABSTRACT

A solid fuel, portable stove reduces smoke emissions and provides for a high temperature of combustion in a compact and easily manufacturable design. A main housing (11) comprises a combustion chamber (12) for containing fuel for combustion and a fan (50) configured to force air into the combustion chamber. A rechargeable electrical power source (40) is used for driving the fan (50) and a thermoelectric element (31) provides power to the fan and to the rechargeable power source. In one embodiment, the thermoelectric element also provides excess output power to a connected device (D) such as a low voltage white light emitting diode, thereby providing a self illuminating, rechargeable stove which is suitable for sunset or early evening cooking.

34 Claims, 6 Drawing Sheets

(56) References Cited

U.S. PATENT DOCUMENTS

| | | | |
|---|---|---|---|
| 5,495,829 A | 3/1996 | Jayaraman | |
| 5,516,381 A * | 5/1996 | Kawai et al. | 148/410 |
| 5,544,488 A | 8/1996 | Reid | |
| 6,095,767 A * | 8/2000 | Caughey | 417/411 |
| 6,588,419 B1 | 7/2003 | Buezis et al. | |
| 6,611,117 B1 * | 8/2003 | Hardt | 318/400.22 |
| 7,168,363 B1 * | 1/2007 | Brown | 99/421 M |
| 2004/0238524 A1 | 12/2004 | Lerner | |

FOREIGN PATENT DOCUMENTS

| | | |
|---|---|---|
| GB | 2125160 A | 2/1984 |
| JP | 09250757 A | 9/1997 |
| JP | 2002110256 A | 4/2002 |
| JP | 2003130355 A | 5/2003 |

* cited by examiner

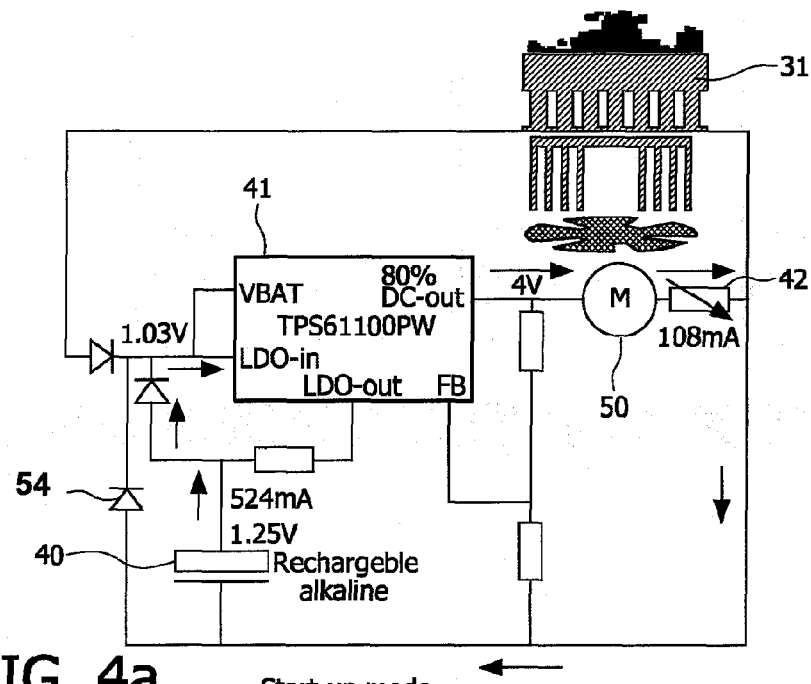
FIG. 4a Start-up mode
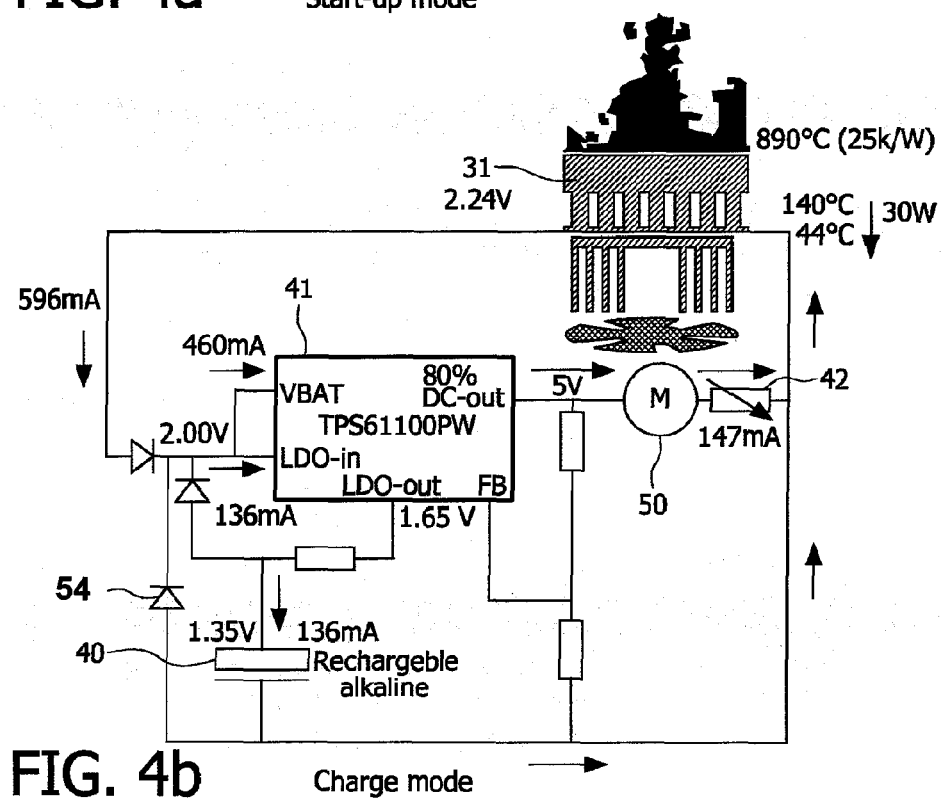
FIG. 4b Charge mode

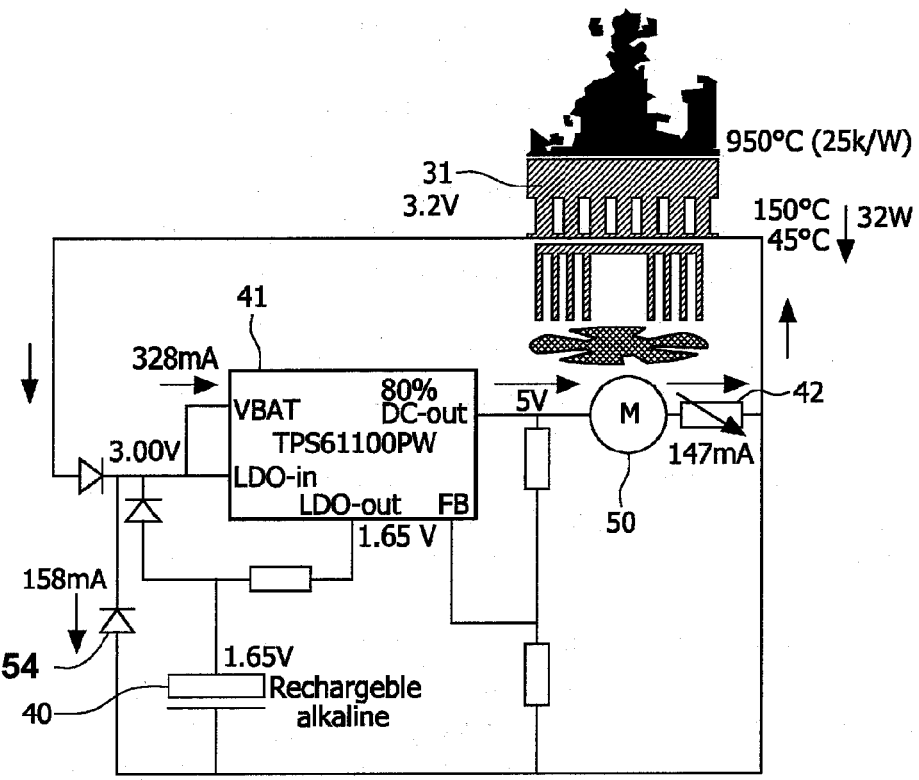
FIG. 4c  Normal mode
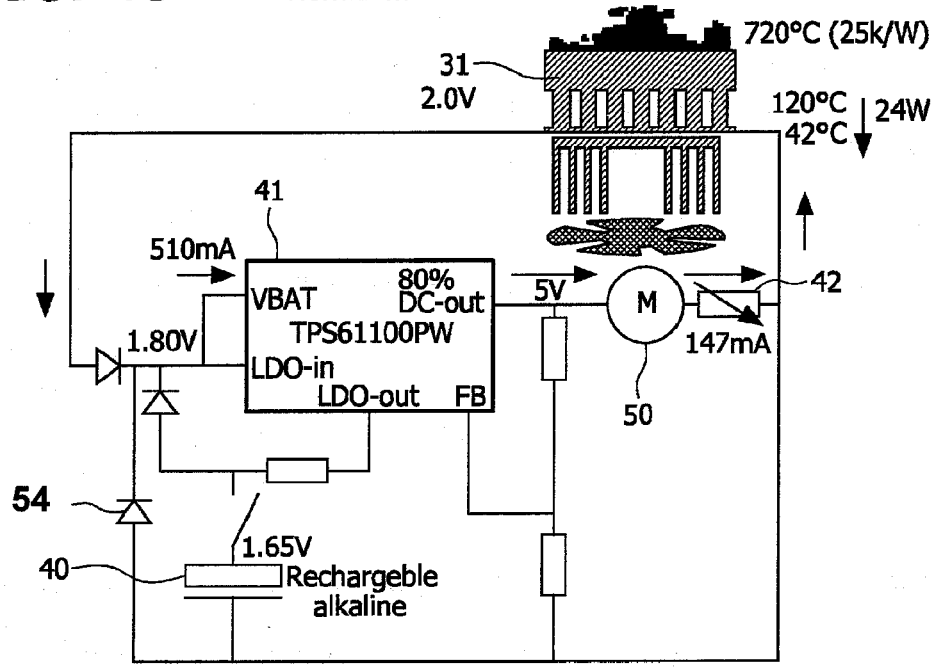
FIG. 4d  Cool down mode

COOKING STOVES

The present invention relates to cooking stoves, and in particular to cooking stoves capable of burning solid fuels using forced convection to increase burning efficiency and reduce pollution.

It is estimated that approximately 2.5 billion people in the world burn wood for cooking which is slow, inefficient and results in substantial smoke emissions. Many deaths each year may be attributed to such smoke emissions. In addition, poor efficiency woodstoves use more natural timber resource with consequences for deforestation.

Smokeless woodstoves using fan assistance are known in the art, but investigations by the inventor have identified a significant number of disadvantages with such prior art cooking stoves. These disadvantages include one or more of: (i) unreliability and a tendency for fans to burn out, (ii) a lack of good heating control, (iii) a cost of manufacture that is incompatible with the under-developed and developing parts of the world, (iv) a less than optimum 'smokeless' performance especially during a warm up phase of the stove, and (v) a requirement for service parts such as replacement batteries that is not ideal for use in remote and under-developed parts of the world.

U.S. Pat. No. 3,868,943 describes a forced draft, solid fuel portable camping stove including a battery powered fan for forced convection of air to a combustion chamber. The fan is powered by a battery, and air is delivered to the combustion chamber via passages adjacent to the chamber to pre-heat the air. GB 2125160 describes a cooking stove having an air chamber into which air for combustion is drawn from the exterior of the stove either by natural convection or by a hand-operated air pump or combination of both. GB 2081888 describes a solid fuel heating stove in which a motor and fan is positioned within the exhaust flue of the stove driven by a thermocouple positioned on top of the stove. U.S. Pat. No. 5,544,488 describes a fan externally mounted to a heat source for distributing air heated by the heat source about a room, in which the fan is powered by a thermocouple on top of the heat source.

It is an object of the present invention to provide an improved efficiency and low cost solid fuel burning stove that overcomes some or all of the advantages of the prior art.

According to one aspect, the present invention provides a solid fuel, portable stove comprising:
a combustion chamber for containing fuel for combustion;
a fan configured to force air into the combustion chamber;
a rechargeable electrical power source for driving the fan; and
a thermoelectric element for providing power to the fan and to the rechargeable power source.

According to another aspect, the present invention provides a solid fuel, portable stove comprising:
a combustion chamber for containing fuel for combustion;
a fan comprising an electric motor and an impeller positioned adjacent to the combustion chamber configured to force air into the combustion chamber;
an electrical power source for driving the fan; and
a heat shield disposed between the electric motor and the combustion chamber to shield the motor from heat from the combustion chamber.

According to another aspect, the present invention provides a solid fuel, portable stove comprising:
a combustion chamber for containing fuel for combustion;
a fan configured to force air into the combustion chamber; and
a thermoelectric element for providing power to the fan and having a first active surface in close proximity to the combustion chamber and a second active surface receiving a cooling draught from the fan.

Embodiments of the present invention will now be described by way of example and with reference to the accompanying drawings in which:

FIGS. 4a to 4d show a series of schematic wiring diagrams illustrating the different modes of operation of the stove of FIG. 3.

Figure 1:
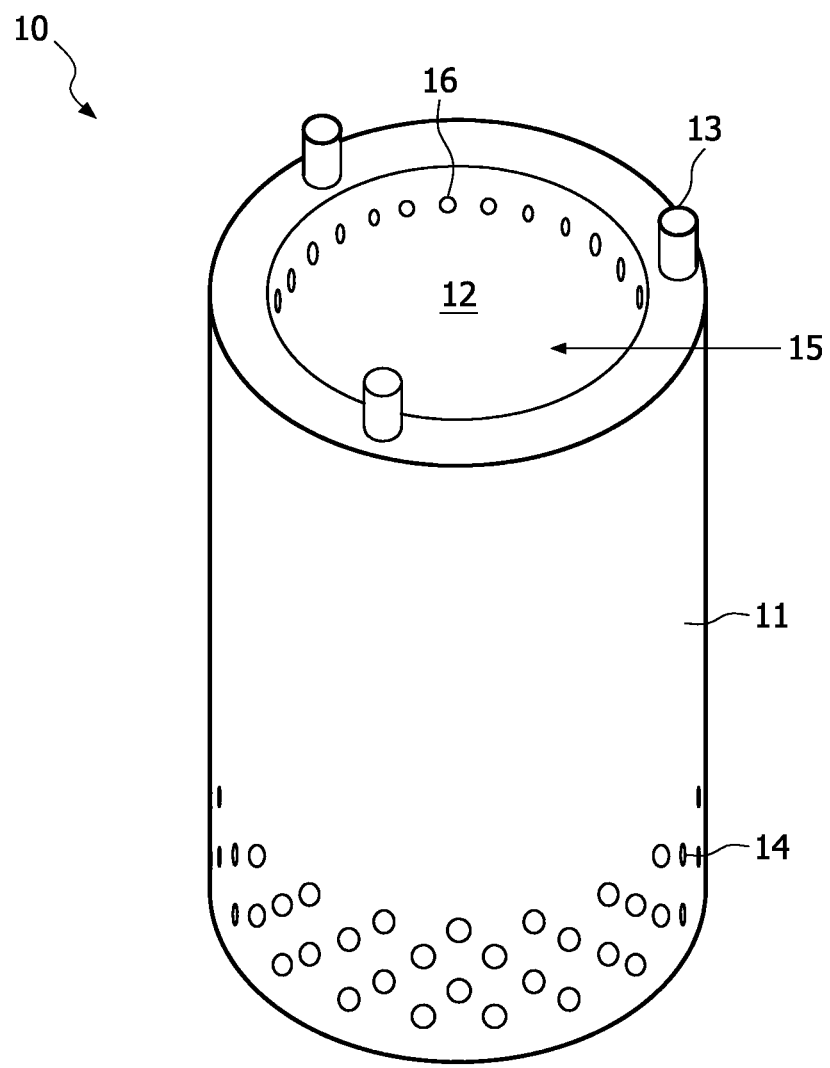
FIG. 1 shows a perspective view of a high efficiency, portable stove suitable for cooking.

With reference to FIG. 1, a 'smokeless' stove 10 comprises a substantially cylindrical housing 11, a combustion chamber 12 formed within an upper portion of the housing and having a generally open top end 15 for use as a cooking surface. The generally open top end 15 includes a number of support struts 13 or the like for supporting a cooking vessel such as a pan on the top. The generally open top end 15 may be at least partially covered by a mesh, grid or other open structure (not shown) for further supporting a cooking vessel while still allowing efficient egress of heat in an upward direction. The expression 'smokeless' is used here to indicate a substantially reduced smoke output for any given fuel when compared with stoves that do not use forced convection and therefore have a significantly lower combustion temperature.

The housing 11 includes a series of air inlets 14 at a lower end thereof for ingress of air, which is used for forced convection through the combustion chamber 12 as will be described below. The stove 10 may be provided with a removable carrying handle (not shown) which may be attached to brackets on the housing 11 (also not shown). A series of upper air outlets 16 into the combustion chamber 12 are also visible in FIG. 1.

Figure 2:
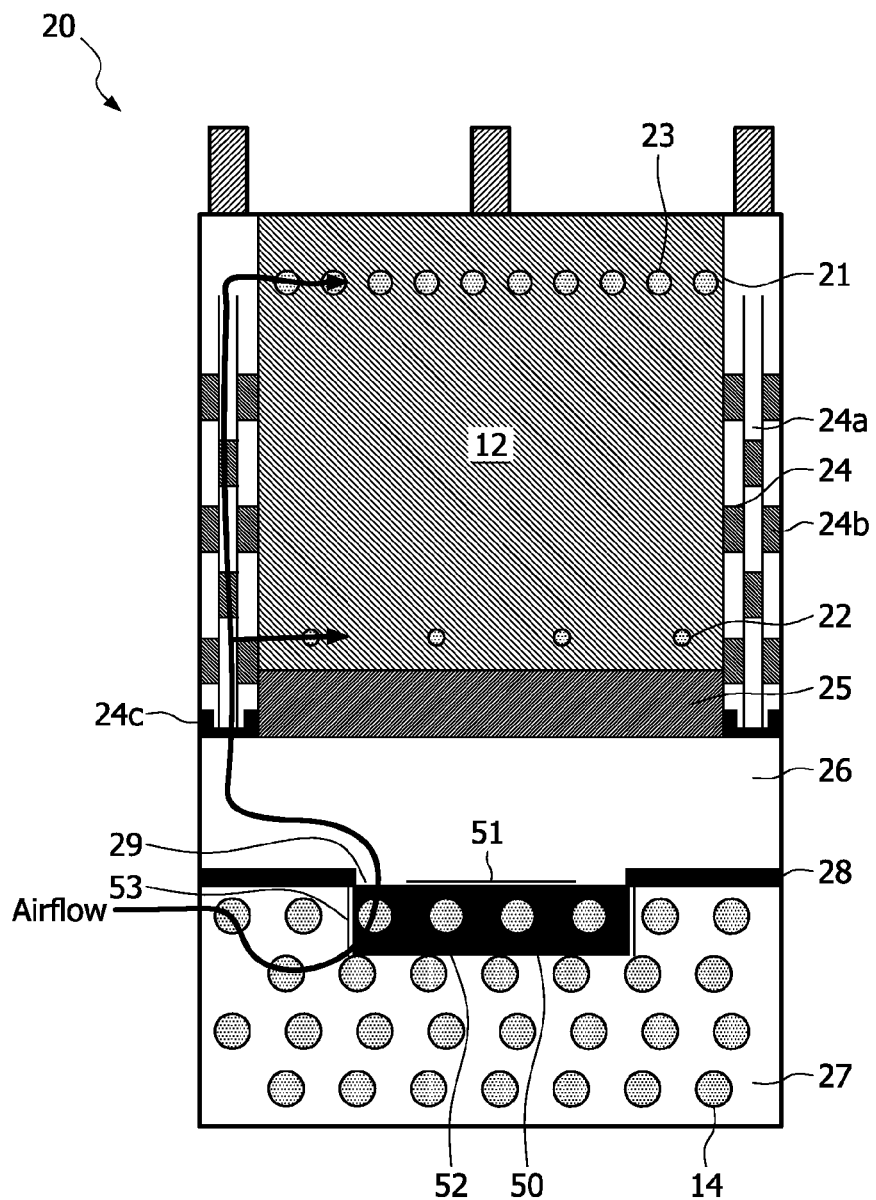
FIG. 2 shows a schematic side cross sectional view showing internal detail of a first embodiment of the stove of FIG. 1.

FIG. 2 shows the internal arrangements of a first embodiment of the stove 20. The combustion chamber 12 is defined by an inner cylindrical vessel 21 having a series of lower air outlets 22 and a series of upper air outlets 23 in the vertical walls of the combustion chamber. An annular space is formed between the vertical walls of the inner cylindrical chamber 21 and the housing 11, which acts as a preheat chamber. The annular space is filled with an air distributor 24 which preferably comprises a series of cylindrical metal sheets 24a with punched out ribs 24b maintaining separation between the sheets to provide air conduits. The metal sheets 24a guide the air flow and reflect heat back into the combustion chamber 12, preheating the air that enters the combustion chamber through the upper air outlets 23 and ensuring that the outer surface 11 remains sufficiently cool in operation to be safe to the touch. The cylindrical metal sheets are held in place by a supporting structure 24c.

The base of the cylindrical vessel 21 includes a thermal isolation structure 25 which acts as a heat shield reducing downward radiation of heat towards an intermediate chamber 26 and a lower chamber 27 of the housing 11. The intermediate chamber 26 and lower chamber 27 are separated by a wall 28 having an aperture 29. Adjacent to the aperture 29 is mounted a low profile fan 50 having a central motor 52 and integral outwardly radiating blades 53 forming an impeller to direct air through the aperture 29. The central motor 52 is preferably protected by a further heat shield element 51, which may be a thin layer of heat reflective material such as aluminum foil disposed on the motor. The lower chamber 27 is bounded by the housing 11 which includes the air inlets 14.

In use, the fan 50 draws air through the air inlets 14, and blows it through aperture 29 into the intermediate chamber 26. Intermediate chamber 26 acts as a distribution chamber to feed air into the annular space and the air distributor 24. Air flows between the sheets 24a of the air distributor 24 to warm the air and direct it to the lower and upper air inlets 22, 23 of the combustion chamber 12.

Heat from the combustion chamber 12 is substantially prevented from radiating downwards by the thermal isolation structure 25 and is also reflected radially back into the combustion chamber 12 by the reflective sheets 24a within the air distributor 24. In addition or instead, the internal surfaces of the walls of the housing 11 may be made highly reflective or coated with reflective material to achieve the same objective. Thus, air passing through the distributor 24 is preheated by the heat of the combustion chamber 12.

A particular advantage of the design of stove of FIG. 2 is that the fan 50 can be placed close to the combustion chamber 12 for a compact design of stove, using a very low cost motor 52 typically including plastic components, which is protected from the heat of the stove by a heat shield comprising thermal isolation structure 25 and reflector 51. The fan blades 53 or impeller are radially outward of the motor 52 and therefore not blocked by the heat reflector 51. The fan blades can also be formed from, or covered by, heat reflective material such as aluminum foil.

In one embodiment, the fan 50 comprises a 1 W brushless DC fan driven by a 3 to 7 V power supply (not shown), compatible with a 5 V motor. In another embodiment, the fan is a 12 V driven by an 8 to 14 V power supply, not shown. The power supply may be an internally mounted battery accessible from the base of the stove, or may be an external supply where available. Tests have shown that the stove 11 is capable of boiling a liter of water in 4 minutes, without significant soot and smoke, with a combustion temperature of more than 1000° C. Food may be simmered at the lower voltage range or boiled at the higher voltage range thereby providing good cooking control.

Figure 3:
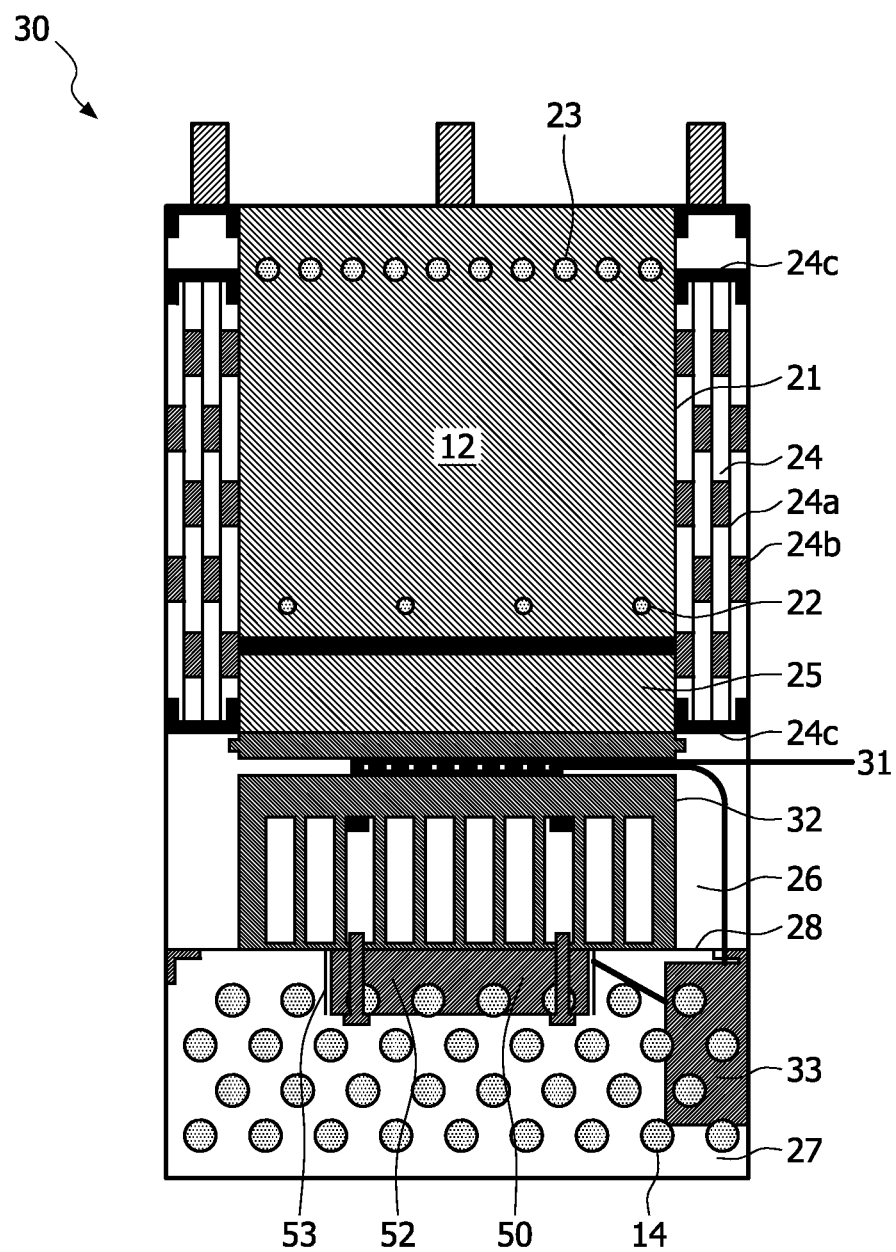
FIG. 3 shows a schematic side cross sectional view showing internal detail of a second embodiment of the stove of FIG. 1.

FIG. 3 shows the internal arrangements of a second embodiment of the stove 30. The combustion chamber 12, inner cylindrical vessel 21, lower air outlets 22, upper air outlets 23, air distributor 24, thermal isolation structure 25, lower chamber 27, wall 28, aperture 29 and fan 50 are as described in connection with FIG. 2.

The intermediate chamber 26 is provided with a thermoelectric element 31 that has a first active surface in close proximity to the combustion chamber 12 and a second active surface positioned to receive a cooling draught from the fan 50. In the preferred arrangement shown, the second active surface of the thermoelectric element is in direct thermal association with, or forms part of, a heat sink arrangement 32 which is cooled by the fan. The first active surface of the thermoelectric element may be in close direct contact with a lower wall of the combustion chamber 12, or isolation structure 25. The thermoelectric element 31 may be embedded into the isolation structure 25 to increase the temperature available at the first active surface. In view of the heat shielding effects of the thermoelectric element 31 and heat sink 32, a separate heat shield for motor 52 might not be required with this arrangement.

The thermoelectric element 31 is any suitable device that converts heat energy to electrical energy, such as a thermocouple or Peltier element. Such thermoelectric elements conventionally generate a voltage based on the thermal gradient across the device between a first and second active surface thereof. The thermoelectric element provides electrical power to the fan 50. In use, the fan provides air flow to the heat sink 32 and thermoelectric element 31 as well as to the air distributor 24. In this manner, the second active surface of the thermoelectric element is maintained at a substantially lower temperature than would otherwise be the case which increases the power output available from the element, and thus increases the available airflow to the combustion chamber 12.

An electronic control unit 33 is also housed in the lower chamber 27, where it is also protected from the heat of the stove, the functions of which control unit are now described in connection with FIGS. 4a to 4d.

The electronic control unit 33 includes a rechargeable battery 40 and a controller 41 configured to operate the stove, preferably in each one of four possible modes. In the preferred embodiment, the electronic control unit is adapted to automatically sequence through each of the four modes in turn, according to the sensed operating conditions, e.g. heat of the fire. A temperature sensor (not shown) may be used to determine the heat of combustion, or this may be deduced from the electrical output of the thermoelectric element 31.

In a first mode, depicted in FIG. 4a and labelled the 'start-up' mode, power from the rechargeable battery 40 is used to drive the fan 50 even when no (or insufficient) power is available from the thermoelectric element 31. In this way, the fuel being burnt in the combustion chamber 12 is enabled to reach optimum high temperatures very quickly, considerably reducing smoke and other polluting emissions during the start up phase of the stove.

A second mode, depicted in FIG. 4b and labelled 'charge' mode, is triggered when the temperature reaches an appropriate level. In the second mode, the fuel in the combustion chamber 12 is burning at sufficient temperature that the thermoelectric element 31 is capable of providing more than sufficient power to the fan 50 for maintaining adequate forced convection to the combustion chamber, and thus also provides sufficient power to recharge the battery 40.

A third mode, depicted in FIG. 4b and labelled 'normal' mode, is triggered when the battery returns to a condition of full charge. In the third mode, the fuel in the combustion chamber 12 is burning at sufficient temperature that the thermoelectric element 31 is capable of providing at least sufficient power to the fan 50 for maintaining adequate forced convection to the combustion chamber 12. The battery is fully charged and any excess power is diverted through zener diode 54.

A fourth mode, depicted in FIG. 4d and labelled 'cool down' mode, is triggered when the temperature falls, e.g. due to exhaustion of the fuel in the combustion chamber. In the fourth mode, the fan 50 no longer needs to maintain combustion which has finished. In this mode, the battery 40 is isolated and any power available from the thermoelectric element 31 is directed to the fan 50 simply to accelerate cooling of the stove as a whole, but without discharging the battery 40. This prevents residual heat from the combustion chamber from building up within the housing 11 and potentially damaging any one or more of the thermoelectric element, the fan and the electronic control circuit. The accelerated cooling provided by the fourth mode also aids portability of the stove ensuring that the stove can safely be moved or carried without risk of burning much more quickly.

A variable resistor or other controller 42 is used to control the motor speed, and therefore the cooking temperature of the stove. The controller 41 is preferably a DC-DC converter adapted to provide sufficiently high voltage for driving the fan and also to provide a stable voltage supply for battery charging, independent of the supply voltage available from the thermoelectric element 31. The numeric examples of temperature, power and current flow given in FIGS. 4a to 4d are illustrative only of an exemplary embodiment.

In the embodiment of FIGS. 3 and 4, the rechargeable battery in use is preferably of the alkaline variety which is cadmium- and lithium-free and has very low self-discharge.

Figure 5:
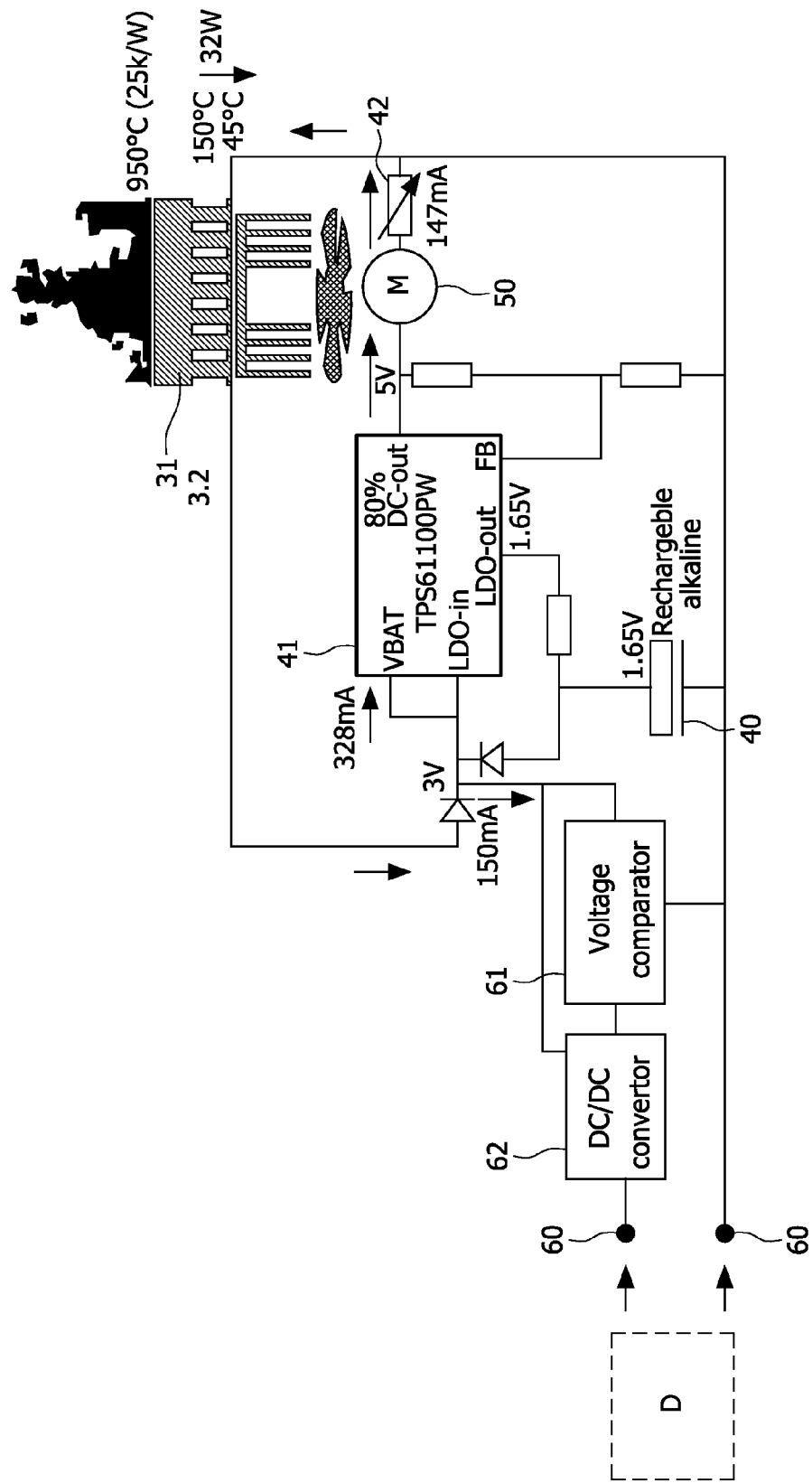
FIG. 5 shows a schematic wiring diagram of another embodiment of the stove enabled to supply excess electrical power to a device.

FIG. 5 illustrates a wiring diagram for a further embodiment in which the zener diode 54 is replaced by power output means 60, a direct current to direct current DC-DC converter 62, and a voltage comparator 61. Power output at the output means 60 is supplied by the thermoelectric element 31 via the controller 41 to comparator 61. As previously described, in the third mode of operation, the fuel in the combustion chamber 12 is burning at sufficient temperature that the thermoelectric element 31 is capable of providing at least sufficient power to the fan 50 for maintaining adequate forced convection to the combustion chamber 12. In this 'normal mode', the battery 40 is fully charged and any excess power generated by the thermoelectric element is directed to the power output means 60.

For example, when enough power is available the voltage of the thermoelectric element will rise to above about 3V. This rise is detected by the voltage comparator 61 that enables the DC-DC converter 62. The DC-DC converter then generates the required voltage (or current) at the output 62. The DC-DC converter is configured to generate enough power to lower the voltage from the thermoelectric element to about 3V. Standard circuitry precautions (not shown) may apply to prevent oscillation.

In one example, the device may be a suitable radio.

In another example, the device may be a mobile phone which can usefully be recharged whilst the stove is operating. This is particularly useful where the availability of a power source for driving or recharging devices is limited.

For these examples the voltage comparator ensures that only excess power is available at the output, enabling fan 50 operation and hence stove operation.

In yet a further embodiment, the device (D) is a lighting component in the form of a white light emitting diode (LED). An advantage of such a device is that it will effectively regulate the voltage without the need for the comparator 61 and converter 62. Hence, the stove may be provided with detachable/re-attachable or permanently fitted (not shown in FIG. 5) lighting devices which will automatically power up when the stove reaches the third mode of operation.

This is particularly useful for cooking at sunset or early evening, which is often when such stoves are used. In particular, many of the aforementioned 2.5 billion people who use wood burning stoves are doing so since they have no access (or limited access) to electricity. As the sun goes down the stove heats up and is cycled through the first and second mode. Once it reaches the third mode (i.e. the battery 40 is fully recharged) the LEDs are switched on and provide some useful artificial light.

In tests, it was found that the recharging requirements of the alkaline battery 40 match well with the driving requirements of many white light emitting diodes and handheld devices. For example, the thermoelectric element 31 outputs sufficient power to drive 3.5V white LEDs at a current of 30 mA. In fact, the tests have shown that between 5 and 10 white LEDs of this type may be lit by the excess power generated in the normal mode.

Those skilled in the art will readily appreciate that the excess power generated by the thermoelectric element depends in part on the specification of the thermoelectric element itself. For example, an element with a suitably larger potential power output may be chosen depending on the power or recharging requirements of the applications envisaged.

Hence the stove may also provide a secondary power source function suitable for driving or recharging devices.

A significant advantage of the design of stove described above is that the fan is sufficiently protected from the direct source of heat that a cheap mass produced motor with plastic components may be used, even though placed at only a short distance from the combustion chamber, resulting in a compact stove. Such motors also prove to be much more reliable and have a longer design life. Positioning of the motor in the supply air stream means that the motor is self-cooling, and also can be conveniently used to cool the cool side of the thermoelectric element.

Other embodiments are intentionally within the scope of the accompanying claims.

The invention claimed is:

1. A solid fuel, portable stove comprising:
a combustion chamber for containing fuel for combustion;
a fan configured to force air into the combustion chamber;
a rechargeable electrical power source for driving the fan;
a thermoelectric element for providing power to the fan and to the rechargeable power source; and
a controller configured to automatically power up an accessory device using power delivered from the thermoelectric element when the rechargeable power source is charged by the power delivered from the thermoelectric element.

2. The stove of claim 1, wherein the fan comprises an electric motor and an impeller positioned adjacent to the combustion chamber, and the stove further includes a heat shield disposed between the electric motor and the combustion chamber.

3. The stove of claim 2, wherein the heat shield is a thin film of heat reflective material positioned on the motor.

4. The stove of claim 3, wherein the heat shield further comprises a thin film of heat reflective material disposed on the blades of the impeller.

5. The stove of claim 1, wherein the thermoelectric element is disposed between the combustion chamber and the fan such that, in use, the thermoelectric element has a first active surface in close proximity to the combustion chamber and a second active surface receiving a cooling draught from the fan.

6. The stove of claim 5, further including a heat sink in thermal contact with the second active surface of the thermoelectric element.

7. The stove of claim 1, wherein the rechargeable power source is a rechargeable alkaline battery.

8. The stove of claim 1, wherein the controller is further configured to supply driving power to the fan when a temperature gradient across the thermoelectric element is insufficient to provide adequate power for forced convection to the combustion chamber.

9. The stove of claim 1, wherein the controller is further configured to provide recharging power to the rechargeable power source when a temperature gradient across the thermoelectric element is more than sufficient to provide adequate power for forced convection to the combustion chamber.

10. The stove of claim 1, wherein the controller is further configured to provide recharging power to the rechargeable power source when a temperature gradient across the thermoelectric element is sufficient to provide charging power.

11. The stove of claim 1, wherein the controller is further configured to automatically sequence through: a first mode in which the rechargeable power source is used to provide power to drive the fan; a second mode in which the thermoelectric element is used to provide power to drive the fan and to recharge the rechargeable power source; a third mode in which the thermoelectric element is used to provide power to drive the fan; and a fourth mode in which rechargeable power source is isolated and any available power from the thermoelectric element is used to drive the fan.

12. The stove of claim 1, wherein the fan comprises a DC brushless motor and an impeller coupled thereto.

13. The stove of claim 12, further including a DC-DC converter configured to provide sufficient voltage for driving the fan and to provide a voltage for battery charging, from a variable voltage output of the thermoelectric element.

14. The stove of claim 1, wherein the controller is further configured to supply variable driving power to the fan to control a combustion temperature in the stove.

15. The stove of claim 1, further including a preheat chamber disposed around the combustion chamber and providing air flow communication from the fan into the combustion chamber, the preheat chamber comprising an air distributor including heat reflectors adapted to reflect heat radiated from the combustion chamber back towards the combustion chamber.

16. The stove of claim 1, further comprising power output means, and wherein the thermoelectric element, for providing power to the fan and to the rechargeable power source, also provides power to the accessory device via the power output means.

17. The stove of claim 16, wherein the power output means further comprises a voltage comparator.

18. The stove of claim 17, wherein the power output means further comprises a converter.

19. The stove of claim 16, wherein the accessory device comprises a lighting component.

20. The stove of claim 19, wherein the lighting component comprises at least one light emitting diode.

21. The stove of claim 1, further comprising a zener diode configured to divert charging power from the thermoelectric element when the rechargeable power source is charged.

22. A solid fuel, portable stove comprising:
a combustion chamber for containing fuel for combustion;
a fan comprising an electric motor and an impeller positioned adjacent to the combustion chamber configured to force air into the combustion chamber;
an electrical power source for driving the fan;
a heat shield disposed between the electric motor and the combustion chamber to shield the motor from heat from the combustion chamber;
a thermoelectric element for providing power to the fan and to the electrical power source for recharging the electrical power source; and
a controller configured to automatically power up an accessory device using power delivered from the thermoelectric element when the electrical power source is charged by the power delivered from the thermoelectric element.

23. The stove of claim 22, wherein the electric motor is a brushless DC motor.

24. The stove of claim 22, wherein the controller is further configured to supply variable driving power to the fan to control a combustion temperature in the stove.

25. A solid fuel, portable stove comprising:
a combustion chamber for containing fuel for combustion;
a fan configured to force air into the combustion chamber;
a thermoelectric element for providing power to the fan and having a first active surface in close proximity to the combustion chamber and a second active surface receiving a cooling draught from the fan; and
a controller configured to automatically power up an accessory device using power delivered from the thermoelectric element when the electrical power source is charged by the power delivered from the thermoelectric element.

26. A combustion assembly comprising:
a combustion chamber for containing fuel for combustion;
a fan configured to force air into the combustion chamber;
a rechargeable electrical power source for driving the fan;
a thermoelectric element for providing power to the fan and to the rechargeable power source; and
a controller configured to automatically power up an accessory device using power delivered from the thermoelectric element when the electrical power source is charged by the power delivered from the thermoelectric element.

27. The combustion assembly of claim 26, wherein the fan comprises an electric motor and an impeller positioned adjacent to the combustion chamber, and further including a heat shield disposed between the electric motor and the combustion chamber.

28. The combustion assembly of claim 27, wherein the heat shield is a thin film of heat reflective material positioned on the motor.

29. The combustion assembly of claim 27, wherein the heat shield further comprises a thin film of heat reflective material disposed on the blades of the impeller.

30. The combustion assembly of claim 26, wherein the thermoelectric element is disposed between the combustion chamber and the fan such that, in use, the thermoelectric element has a first active surface in close proximity to the combustion chamber and a second active surface receiving a cooling draught from the fan.

31. The combustion assembly of claim 26, wherein the controller is further configured to supply driving power to the fan when a temperature gradient across the thermoelectric element is insufficient to provide adequate power for forced convection to the combustion chamber.

32. The combustion assembly of claim 31, wherein the controller is further configured to automatically sequence through: a first mode in which the rechargeable power source is used to provide power to drive the fan; a second mode in which the thermoelectric element is used to provide power to drive the fan and to recharge the rechargeable power source; a third mode in which the thermoelectric element is used to provide power to drive the fan; and a fourth mode in which rechargeable power source is isolated and any available power from the thermoelectric element is used to drive the fan.

33. The combustion assembly of claim 26, wherein the controller is further configured to supply variable driving power to the fan to control a combustion temperature in the stove.

34. The combustion assembly of claim 26, further comprising a preheat chamber disposed around the combustion chamber and providing air flow communication from the fan into the combustion chamber, the preheat chamber comprising an air distributor including heat reflectors adapted to reflect heat radiated from the combustion chamber back towards the combustion chamber.

* * * * *